United States Patent
Yuzuriha et al.

(10) Patent No.: US 6,458,655 B1
(45) Date of Patent: Oct. 1, 2002

(54) METHOD OF MANUFACTURING SEMICONDUCTOR DEVICE AND FLASH MEMORY

(75) Inventors: Kojiro Yuzuriha, Hyogo (JP); Shu Shimizu, Hyogo (JP); Tamotsu Tanaka, Hyogo (JP); Takashi Yano, Hyogo (JP)

(73) Assignees: Mitsubishi Denki Kabushiki Kaisha, Tokyo (JP); Ryoden Semiconductor System Engineering, Hyogo (JP)

( * ) Notice: Subject to any disclaimer, the term of this patent is extended or adjusted under 35 U.S.C. 154(b) by 0 days.

(21) Appl. No.: 09/588,475

(22) Filed: Jun. 7, 2000

(30) Foreign Application Priority Data

Jan. 17, 2000 (JP) ........................................ 2000-007585

(51) Int. Cl.⁷ ............................................ H01L 21/336
(52) U.S. Cl. ....................... 438/257; 438/264; 438/266; 438/593; 438/594; 438/763; 438/689; 438/695; 438/706; 438/725
(58) Field of Search ............................... 438/257, 266, 438/264, 593, 594, 763, 689, 695, 706, 725

(56) References Cited

U.S. PATENT DOCUMENTS

| 5,210,047 | A | * | 5/1993 | Woo et al. ...................... 437/43 |
| 5,460,991 | A | * | 10/1995 | Hong ........................... 437/43 |
| 5,631,178 | A | * | 5/1997 | Vogel et al. |
| 5,789,293 | A | * | 8/1998 | Cho et al. .................... 438/257 |
| 6,040,216 | A | * | 3/2000 | Sung ........................... 438/257 |
| 6,117,732 | A | * | 9/2000 | Chu et al. ..................... 438/264 |

* cited by examiner

*Primary Examiner*—Michael Sherry
*Assistant Examiner*—Lisa Kilday
(74) *Attorney, Agent, or Firm*—McDermott, Will & Emery

(57) ABSTRACT

A semiconductor manufacturing method is mainly contemplated, improved to prevent an altered surface layer of a resist from being removed when a single patterned resist is used to provide dry-etch and wet-etch successively. On a semiconductor substrate an insulation film and a conductive layer are formed successively. On the conductive layer a patterned resist is formed. With the patterned resist used as a mask, the conductive layer is dry-etched. A surface layer of the patterned resist is partially removed. With the patterned resist used as a mask, the insulation film is wet-etched.

5 Claims, 12 Drawing Sheets

METHOD OF MANUFACTURING SEMICONDUCTOR DEVICE AND FLASH MEMORY

BACKGROUND OF THE INVENTION

1. Field of the Invention

The present invention relates generally to methods of manufacturing semiconductor devices and particularly to methods of manufacturing semiconductor devices including a step of dry etch and wet etch provided successively. The present invention also relates to methods of manufacturing flash memories including a step of dry etch and wet etch provided successively. The present invention also relates to flash memories manufactured by such manufacturing methods. The present invention also relates to methods of manufacturing static random access memories (SRAMs).

2. Description of the Background Art

FIG. 11 shows a cross section of a memory cell of a conventional flash memory.

Referring to FIG. 11, in a surface of a semiconductor substrate containing a p dopant a p doped region 1a is formed. On semiconductor substrate 1 a floating gate 4 is formed with a tunnel oxide film 3 posed therebetween. In a surface of p doped region 1a on opposite sides of floating gate 4, source/drain regions 2a and 2b are formed. On floating gate 4 an insulation film 8 is formed. On insulation film 8 a control gate 9 is formed. On semiconductor substrate 1, insulation layers 10 and 11 are formed such that they cover control gate 9.

The flash memory operates as described below.

In write operation, drain region 2b receives a drain voltage of approximately 6 to 8V and control gate 9 receives a gate voltage of approximately 10 to 15V. Source region 2a and semiconductor substrate 1 have a voltage held at a ground voltage. As such a current of several hundreds $\mu A$ flows through a channel region 2c. Of the electrons flowing from source region 2a to drain region 2b, the electrons accelerated in a vicinity of drain region 2b becomes those with high energy (i.e., hot electrons). Such electrons flow in a direction indicated by an arrow 12 due to an electric field resulting from the gate voltage applied to control gate 9, and are thus introduced into floating gate 4. As such electrons accumulate in floating gate 4, the transistor's threshold voltage is increased. Such threshold voltage higher than a predetermined value corresponds to a state. referred to as "0".

In data erase operation, initially source region 2a receives a source voltage of approximately 10 to 15V and control gate 9 and semiconductor substrate 1 are held at a ground potential. Then, drain region 2b is floated, and an electric field resulting from the source voltage applied to source region 2a allows the electrons accumulated in floating gate 4 to flow in a direction indicated by an arrow 13, passing through tunnel insulation film 3 into semiconductor substrate 1. When the electrons accumulated internal to floating gate 4 are extracted, the transistor's threshold is increased. Such threshold voltage lower than a predetermined value corresponds to a state with data erased, referred to as "1". Such erasure allows collective erasure of memory cells formed in a single semiconductor device. In read operation, control gate 9 receives a gate voltage of approximately 5V and drain region 2b receives a drain voltage of approximately 1 to 2V, and then if channel region 2c passes current or the transistor is ON then data is determined to be "1" and if channel region 2c does not pass current or the transistor is OFF then data is determined to be "0".

A flash memory configured as described above is manufactured by a method as described below.

Initially, as shown in FIG. 12, an element isolating oxide film is formed on a semiconductor substrate 1 of monocrystalline silicon to isolate memory cells from each other, isolate transistors in peripheral circuitry from each other, and isolate the cells and the peripheral transistors from each other. Then p doped region 1a in which memory cells are to be formed is formed. Then the substrate's upper surface is oxidized to provide a tunnel insulation film 3 of silicon dioxide ($SiO_2$).

Referring to FIG. 13, chemical vapor deposition (CVD) is employed to deposit polycrystalline silicon on tunnel insulation film 3. The polycrystalline silicon only in the memory cell region is etched in an x direction (a direction horizontal relative to the plane of the figure, not shown) to form a floating gate 4. Then, chemical vapor deposition is similarly employed to form an insulation film 8, such as a silicon nitride (SiN) film, a silicon oxide film. Then, insulation film 8, the polycrystalline silicon and tunnel insulation film 3 are removed in the peripheral-circuitry region. Then, as in forming polycrystalline silicon (floating gate) 4, chemical vapor deposition is employed to deposit polycrystalline silicon serving as control gate 9.

Then, as shown in FIG. 14, on a region with polycrystalline silicon that is desired as a gate electrode a patterned photoresist 14 is provided in a y direction (a direction vertical relative to the plane of the figure). With patterned photoresist 14 used as a mask, the region is anisotropically etched to expose a surface of tunnel insulation film 3.

Then, patterned resist 14 is for example plasma-ashed and thus removed.

As shown in FIG. 15, dopant ions are introduced in a direction indicated by an arrow 15 to form at an upper portion of p doped region 1a heavily n doped regions (source/drain regions) 2a and 2b higher in dopant concentration than p doped region 1a. Then, as shown in FIG. 11, chemical vapor deposition or the like is employed to provide insulation layers 10 and 11 formed of silicon oxide film and serving as a passivation film to complete a flash memory.

The semiconductor device manufacturing method as above has a disadvantage described below with reference to simplified drawings.

As shown in FIG. 16, on a silicon substrate 1 a $SiO_2$ film 2 is formed. On $SiO_2$ film 2 a polysilicon film 3 is deposited. On polysilicon film 3 a patterned photoresist 4 is provided by photolithography. With patterned resist 4 used as a mask, polysilicon film 3 is dry-etched and then successively $SiO_2$ film 2 is etched with a hydrofluoric acid solution.

In the hydroflouric acid solution process, however, when polysilicon film 3 is dry-etched an altered surface layer 5 of patterned photoresist 4 is removed, as shown in FIG. 17. Removed surface layer 5 of the resist adheres onto silicon substrate 1 and thus disadvantageously prevents the underlying $SiO_2$ film 2 from being etched. Furthermore, removed surface layer 5 of the resist disadvantageously flows into the hydrofluoric acid treatment bath and as a foreign matter contaminates the bath.

Furthermore, such problem tends to occur particularly when polysilicon is etched with chloride type gas.

Furthermore, such problem also tends to occur when with a polysilicon film having an insulation film such as $SiO_2$ film, SiN film deposited thereon the $SiO_2$/SiN film is dry-etched, the polysilicon film is dry-etched and the $SiO_2$ film is then wet-etched with hydrofluoric acid solution successively.

SUMMARY OF THE INVENTION

The present invention has been made to solve such disadvantages as described above.

The present invention contemplates an improved semiconductor manufacturing method capable of preventing removal of an altered surface layer of a patterned photoresist.

The present invention also contemplates an improved flash memory manufacturing method preventing removal of an altered surface layer of a patterned photoresist.

The present invention also contemplates an improved static random access memory manufacturing method preventing removal of an altered surface layer of a patterned photoresist.

In accordance with the present invention in one aspect a semiconductor device manufacturing method includes the steps of: initially forming on a semiconductor substrate an insulation film and a conductive layer successively by either deposition or deposition followed by patterning (step 1); forming a patterned resist on the conductive layer (step 2); with the patterned resist used as a mask, dry-etching the conductive layer (step 3); partially removing a surface layer of the patterned resist (step 4); and with the patterned resist used as a mask, etching the insulation film.

In accordance with the present invention, partially removing a surface layer of the patterned resist allows removal of an altered surface of the patterned resist.

In accordance with the present invention in a second aspect a semiconductor device manufacturing method provides step 4 using an $O_2$ plasma etch to partially remove a surface layer of the patterned resist.

In accordance with the present invention in a third aspect a semiconductor device manufacturing method includes using an $O_2$ mixed gas to dry-etch the conductive layer in step 3 and thus providing step 4 in the sequence of dry-etching the conductive layer.

In accordance with the present invention in a fourth aspect a semiconductor device manufacturing method includes the steps of: forming on a semiconductor substrate an insulation film and a conductive layer successively by either deposition or deposition followed by patterning (step 1); forming a patterned resist on the conductive layer (step 2); with the patterned resist used as a mask, dry-etching the conductive layer (step 3); joining together an altered surface layer of the patterned resist and a normal layer of the patterned resist underlying the surface thereof, and thus preventing the altered layer and the normal layer from being removed (step 4); and with the patterned resist used as a mask, etching the insulation film (step 5).

In accordance with the present invention, an altered surface layer of a patterned resist and a normal layer of the patterned resist underlying the surface thereof can be joined together and thus prevented from being removed.

In accordance with the present invention in a fifth aspect a semiconductor device manufacturing method includes in step 4 the step of illuminating a surface of the patterned resist in a $N_2$ ambient with a deep ultraviolet light and subsequently thermally processing the same.

In accordance with the present invention in a sixth aspect a semiconductor device manufacturing method includes in step 4 the step of illuminating a surface of the patterned resist in a dry air with a deep ultraviolet light and subsequently thermally processing the patterned resist.

In accordance with the present invention in a seventh aspect a semiconductor device manufacturing method provides step 4 by thermally processing the patterned resist in a dry air.

In accordance with the present invention in an eighth aspect a flash memory manufacturing method includes the steps of: forming on a surface of a semiconductor substrate an isolating oxide film isolating a memory cell region and a peripheral circuitry region from each other (step 1); forming a tunnel oxide film on a surface of the semiconductor substrate (step 2); forming a first polysilicon layer on the tunnel oxide film (step 3); patterning the tunnel oxide film and the first polysilicon layer as desired (step 4); forming an insulation film on the first polysilicon layer (step 5); forming on the insulation film a patterned resist having an end positioned on the isolating oxide film and covering only the memory cell region (step 6); with the patterned resist used as a mask, dry-etching and thus removing the insulation film and the first polysilicon layer that overlie the peripheral circuitry region (step 7); partially removing a surface of the patterned resist (step 8); with the patterned resist used as a mask, removing the tunnel oxide film overlying the peripheral circuitry region (step 9); removing the patterned resist (step 10); forming on the semiconductor substrate and on the peripheral circuitry region a gate oxide film for a peripheral transistor (step 11); forming a second polysilicon layer on the semiconductor substrate (step 12); forming on the second polysilicon layer an oxide film used as an etching mask (step 13); forming a control gate in the memory cell region and forming a transistor gate for the peripheral circuitry (step 14); and patterning the insulation film and the first polysilicon layer and forming a floating gate (step 15).

In accordance with the present invention, partially removing a surface layer of a patterned resist allows removal of an altered surface layer of the patterned resist.

In accordance with the present invention in a ninth aspect a flash memory includes a semiconductor substrate. On the semiconductor substrate a dummy gate region is provided. On the semiconductor substrate a memory cell region and a peripheral circuitry region are provided to sandwich the dummy gate region. The dummy gate region includes an isolating oxide film formed on the semiconductor substrate. On the isolating oxide film a first conductive layer is provided having an end closer to the peripheral circuitry region that recedes towards the memory cell region. On the first conductive layer an insulation layer is provided having an end closer to the peripheral circuitry region that recedes towards the memory cell region. On the isolating oxide film a second conductive layer is provided covering the first conductive layer and the insulation layer.

In accordance with the present invention in a tenth aspect a semiconductor device manufacturing method in the first or fourth aspect uses a polysilicon film as the conductive layer and dry-etches the conductive layer with a chloride-type gas.

In accordance with the present invention in an eleventh aspect, a flash memory manufacturing method in the eighth aspect at step 6 uses a chlorine gas to dry-etch the patterned resist.

In accordance with the present invention in a twelfth aspect a semiconductor device manufacturing method include the steps of: initially forming on a semiconductor substrate an insulation film and a conductive layer successively (step 1); forming a second insulation film (step 2); forming a patterned resist on the second insulation film (step 3); with the patterned resist used as a mask, dry-etching the second insulation film and the conductive layer (step 4); partially removing a surface layer of the patterned resist (step 5); and with the patterned resist used as a mask, etching the insulation film (step 6).

In accordance with the present invention in a thirteenth aspect a semiconductor manufacturing method provides step 5 using an $O_2$ plasma etch to partially remove a surface of the patterned resist.

In accordance with the present invention in a fourteenth aspect a semiconductor device manufacturing method includes step 4 using an $O_2$ mixed gas to dry-etch the second insulation film and the conductive layer and thus provides step 5 in the sequence of dry-etching the conductive layer.

In accordance with the present invention in a fifteenth aspect a semiconductor device manufacturing method includes the steps of: initially forming on a semiconductor substrate an insulation film and a conductive layer successively (step 1); forming a second insulation film (step 2); forming a patterned resist on the conductive layer (step 3); with the patterned resist used as a mask, dry-etching the conductive layer (step 4); joining together an altered surface layer of the patterned resist and a normal layer of the patterned resist underlying the surface layer thereof and thus preventing the altered surface layer and the normal layer from being removed (step 5); and with the patterned resist used as a mask, etching the insulation film (step 6).

In accordance with the present invention in a sixteenth aspect a semiconductor device manufacturing method includes in step 5 the step of illuminating a surface of the patterned resist in a $N_2$ ambient with a deep ultraviolet light and subsequently thermally processing the patterned resist.

In accordance with the present invention in a seventeenth aspect a semiconductor device manufacturing method includes in step 5 the step of illuminating a surface of the patterned resist in dry air with a deep ultraviolet light and subsequently thermally processing the patterned resist.

In accordance with the present invention in an eighteenth aspect a semiconductor manufacturing method provides step 5 thermally processing the patterned resist in a dry air.

In accordance with the present invention in a nineteenth aspect a flash memory manufacturing method includes the steps of: initially forming on a surface of a semiconductor substrate an isolating oxide film isolating a memory cell region and a peripheral circuitry region from each other (step 1); forming a tunnel oxide film on a surface of the semiconductor substrate (step 2); forming a first polysilicon layer on the tunnel oxide film (step 3); patterning the tunnel oxide film and the first polysilicon layer as desired (step 4); forming an insulation film on the first polysilicon layer (step 5); forming on the insulation film a patterned resist having an end positioned on the isolating oxide film and covering only the memory cell region (step 6); with the patterned resist used as a mask, dry-etching and thus removing the insulation film and the first polysilicon layer that overlie the peripheral circuitry region (step 7); using $O_2$ plasma to etch and thus partially remove a surface layer of the patterned resist (step 8); with the patterned resist used as a mask, removing the tunnel oxide film overlying the peripheral circuitry region (step 9); removing the patterned resist (step 10); forming on the semiconductor substrate and on the peripheral circuitry region a gate oxide film for a peripheral transistor (step 11); forming a second polysilicon layer on the semiconductor substrate (step 12); forming on the second polysilicon layer an oxide film used as an etching mask (step 13); forming a control gate. in the memory cell region and forming a transistor gate for the peripheral circuitry (step 14); and patterning the insulation film and the first polysilicon layer and forming a floating gate (step 15).

In accordance with the present invention in a twentieth aspect a flash memory manufacturing method is characterized in that in step 7 the insulation film and the first polysilicon layer are dry-etched with an $O_2$ mixed gas and that in step 8 the patterned resist's surface layer is partially removed in the dry-etching sequence.

In accordance with the present invention in a twenty-first aspect a flash memory manufacturing method includes the steps of: initially forming on a surface of a semiconductor substrate an isolating oxide film isolating a memory cell region and a peripheral circuitry region from each other (step 1); forming a tunnel oxide film on a surface of the semiconductor substrate (step 2); forming a first polysilicon on the tunnel oxide film (step 3); patterning the tunnel oxide film and the first polysilicon layer, as desired (step 4); forming an insulation film on the first polysilicon layer (step 5); forming on the isolation film a patterned resist having an end positioned on the isolating oxide film and covering only the memory cell region (step 6); with the patterned resist used as a mask, dry-etching and thus removing the insulation film and the first polysilicon layer that overlie on the peripheral circuitry region (step 7); joining together an altered surface layer of the patterned resist and a normal portion of the patterned resist underlying the surface layer thereof and thus preventing the altered surface layer and the underlying normal portion from being removed (step 8); with the patterned resist used as a mask, removing the tunnel oxide film overlying the peripheral circuitry region (step 9); removing the patterned resist (step 10); forming on the semiconductor substrate and on the peripheral circuitry region a gate oxide film for a peripheral transistor (step 11); forming a second polysilicon layer on the semiconductor substrate (step 12); forming on the second polysilicon layer an oxide film used as an etching mask (step 13); forming a control gate in the memory cell region and forming a transistor gate for the peripheral circuitry (step 14); and patterning the insulation film and the first polysilicon layer and forming a floating gate (step 15).

In accordance with the present invention in a twenty-second aspect a flash memory manufacturing method includes step 8 illuminating a surface of the patterned resist in a $N_2$ ambient with a deep ultraviolet light and thermally processing the patterned resist.

In accordance with the present invention in a twenty-third aspect a flash memory manufacturing method includes step 8 illuminating a surface of the patterned resist in a dry air with a deep ultraviolet light and thermally processing the patterned resist.

In accordance with the present invention in a twenty-fourth aspect a flash memory manufacturing method includes step 8 thermally processing the patterned resist in a dry air.

In accordance with the present invention in a twenty-fifth aspect an SRAM manufacturing method includes the steps of: initially forming an isolating oxide film on a surface of a semiconductor substrate (step 1); depositing a gate oxide film on the semiconductor substrate (step 2); depositing a first polysilicon layer on the gate oxide film (step 3); forming a patterned resist having an opening extending from an active region to the isolating oxide film (step 4); with the patterned resist used as a mask, dryetching and thus removing the first polysilicon layer (step 5); partially removing a surface layer of the patterned resist (step 6); again with the patterned resist used as a mask, removing the gate oxide film at a bottom of the patterned resist (step 7); removing the patterned resist (step 8); forming a second polysilicon layer (step 9); forming of resist a pattern providing a gate electrode of an access transistor, a pattern providing a gate electrode of a driver transistor and a pattern providing a gate electrode of a transistor for peripheral circuitry (step 10);

with the patterned resist used as a mask, dry-etching the first and second polysilicon layers (step 11); removing the patterned resist (step 12); doping only an n region with an n dopant (step 13); and thermally processing a resultant product (step 14).

In accordance with the present invention in a twenty-sixth aspect an SRAM manufacturing method includes step 6 using an $O_2$ plasma etch and thus partially remove a surface of the patterned resist.

In accordance with the present invention in a twenty-seventh aspect an SRAM manufacturing method includes in step 5 using an $O_2$ mixed gas to dry-etch the first polysilicon layer and in step 6 partially removing a surface layer of the patterned resist in the dry-etching sequence.

In accordance with the present invention in a twenty-eighth aspect an SRAM manufacturing method includes the steps of: initially forming an isolating oxide film on a surface of a semiconductor substrate (step 1); depositing a gate oxide film on the semiconductor substrate (step 2); depositing a first polysilicon layer on the gate oxide film (step 3); forming a patterned resist having an opening extending from an active region to the isolating oxide film (step 4); with the patterned resist used as a mask, dryetching and thus removing the first polysilicon layer (step 5); joining together an altered surface layer of the patterned resist and a normal portion of the patterned resist underlying the altered surface layer thereof and thus preventing the altered surface layer and the normal portion from being removed (step 6); again with the patterned resist used as a mask, removing the gate oxide film at a bottom of the pattern (step 7); removing the patterned resist (step 8); forming a second polysilicon layer (step 9); forming of resist a pattern providing a gate electrode of an access transistor, a pattern providing a gate electrode of a driver transistor and a pattern providing a gate electrode of a transistor for peripheral circuitry (step 10); with the patterned resist used as a mask, dry-etching the first and second polysilicon layers (step 11); removing the patterned resist (step 12); doping only an n region with an n dopant (step 13); and thermally processing a resultant product (step 14).

In accordance with the present invention in a twenty-ninth aspect an SRAM manufacturing method includes in step 6 the step of illuminating a surface of the patterned resist in a $N_2$ ambient with a deep ultraviolet light and successively thermally processing the patterned resist.

In accordance with the present invention in a thirtieth aspect an SRAM manufacturing method includes in step 6 the step of illuminating a surface of the patterned resist in a dry air with a deep ultraviolet light and successively thermally processing the patterned resist.

In accordance with the present invention in a thirty-first aspect an SRAM manufacturing method includes step 6 thermally processing the patterned resist in a dry air.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention are applicable to any semiconductor device manufacturing methods including successively providing photolithography, dry-etching of polysilicon and wet-etching with a hydrofluoric acid solution, or successively providing photolithography, dry-etching of silicon oxide film, dry-etching of polysilicon and wet-etching with a hydrofluoric acid solution.

First Embodiment

Figure 1:
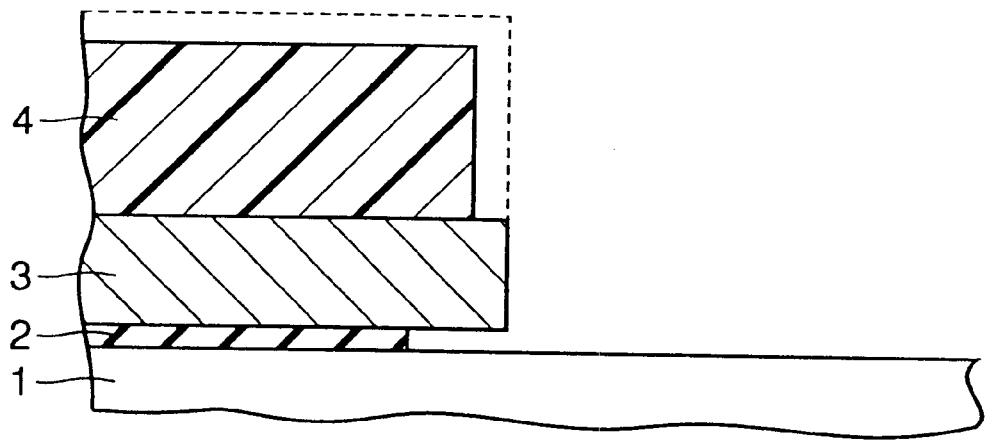
FIG. 1 is a cross section of a semiconductor device for illustrating a manufacturing method according to a first embodiment of the present invention.
Figure 17:
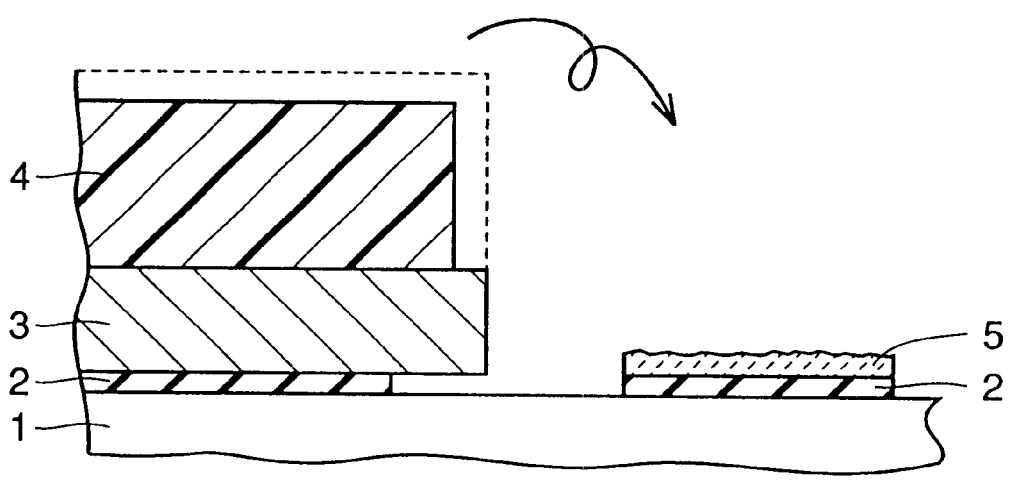

As shown in FIG. 1, on a silicon substrate 1 a $SiO_2$ film 2 is formed. On $SiO_2$ film 2 a polysilicon film 3 is formed through either deposition or deposition followed by patterning. On polysilicon film 3 a patterned resist 4 is formed. With patterned resist 4 used as a mask, polysilicon film 3 is etched. Then, an $O_2$ plasma process (an ashing process) is performed in the sequence of etching polysilicon film 3 or in a separate apparatus. A surface of patterned resist 4 is removed by approximately 10 nm. Then, with patterned resist 4 used as a mask, $SiO_2$ film 2 is processed with a hydrofluoric acid solution. In the present embodiment, the $O_2$ plasma process can partially remove a surface layer of patterned resist 4 to overcome the disadvantage resulting from the conventional method as shown in FIG. 17, i.e., the disadvantage that a removed, altered surface layer of the resist prevents $SiO_2$ film 2 from being etched. It should be noted that it is not disadvantageous that before the hydrofluoric acid solution process, patterned resist 4 recedes from its initial patterned position, i.e., the resist recedes in the horizontal direction by the portion indicated by a dotted line in the figure.

Second Embodiment

The present embodiment also contemplates removing an altered resist. In the present embodiment, the altered resist is removed during a polysilicon etching sequence. More specifically, main-etching of a polysilicon film and over-etching are followed by an etching with $O_2$ mixed for example in an etching sequence as follows:

main etch→ over etch using gaseous $Cl_2$→ post-process using gaseous $Cl_2+O_2$.

In this example, different from the $O_2$ plasma process, the patterned resist less recedes. It should be noted that the etch with gaseous $O_2$ mixed may be provided during the over etch.

Third Embodiment

Figure 18:
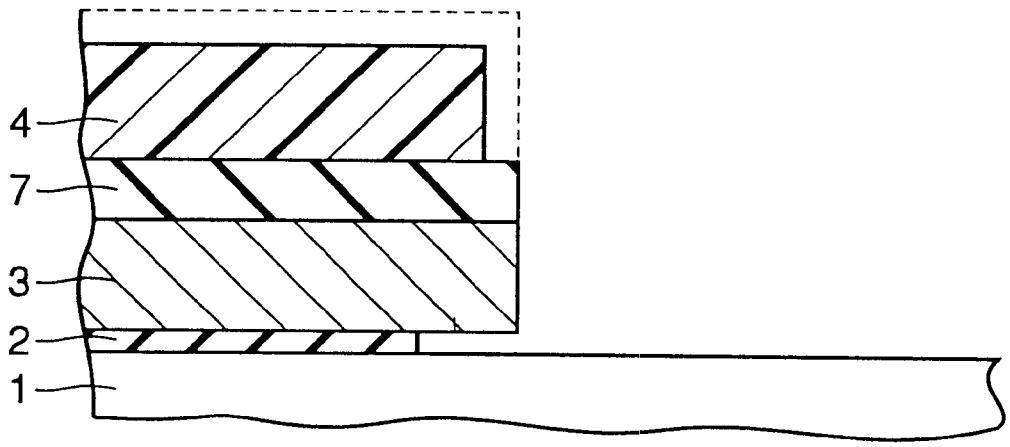
FIG. 18 is a cross section of a semiconductor device for illustrating a method according to a third embodiment of the present invention

As shown in FIG. 18, on a silicon substrate 1 a $SiO_2$ film 2 is formed. On $SiO_2$ film 2 a polysilicon film 3 is formed. On polysilicon film 3 a patterned resist 4 is formed through either deposition or deposition hold by patterning. Then a second insulation film 7 is deposited. Then, with patterned resist 4 used as a mask, the second insulation film 7 and polysilicon film 3 are etched. Then, an $O_2$ plasma process (an ashing process) is performed during the polysilicon film 3 etching sequence or in a separate apparatus. A surface of patterned resist 4 is removed by approximately 10 nm. Then, with patterned resist 4 used as a mask, $SiO_2$ film 2 is processed with a hydrofluoric acid solution. In the present embodiment, the $O_2$ plasma process can partially remove a surface layer of patterned resist 4 to overcome the disadvantage resulting from the FIG. 17 conventional method, i.e., the disadvantage that a removed, altered surface layer of the resist prevents $SiO_2$ film 2 from being etched. It should be noted that patterned resist 4 receding from its initial patterned position, i.e, in the horizontal direction by the portion indicated by a dotted line before the hydrofluoric acid solution process is performed is not disadvantageous.

Fourth Embodiment

The present invention also contemplates removing an altered resist. In the present embodiment, after the second insulation film 7 is etched, in a polysilicon etching sequence the altered resist is removed. More specifically, main-etching of a polysilicon film and over-etching are followed. by an etch with $O_2$ mixed for example in the etching sequence as follows:

main→ etch over etch using gaseous $Cl_2$→ post-process using gaseous $Cl_2+O_2$ .

In this example, different from the $O_2$ plasma process, the patterned resist less recedes. It should be noted that the etch with gaseous $O_2$ mixed may be provided during the over etch.

Fifth Embodiment

In the present embodiment, an altered surface of a resist can be cured to prevent the altered portion from being removed.

Figure 2:
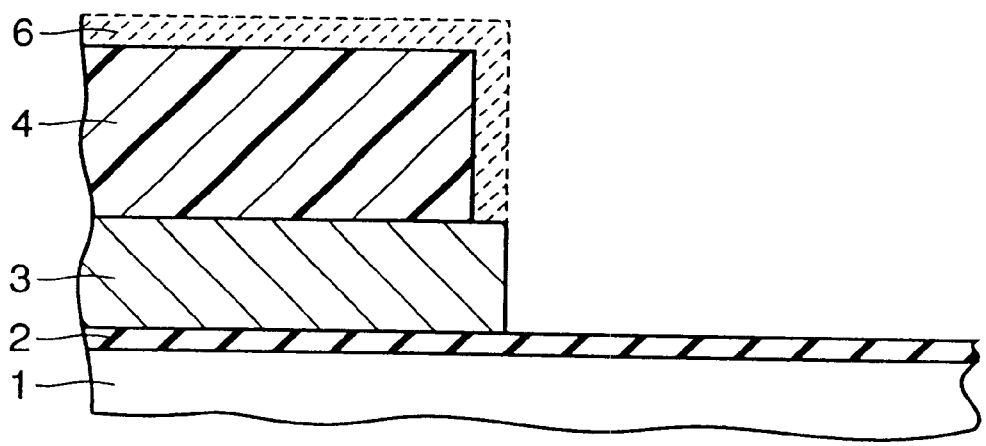
FIGS. 2–4 are cross sections of a semiconductor device manufactured by a semiconductor device manufacturing method according to a fifth embodiment of the present invention, as shown at first to third steps thereof, respectively.

As shown in FIG. 2, on a silicon substrate 1 a $SiO_2$ film 2 is formed. On $SiO_2$ film 2 a polysilicon film 3 is formed. On polysilicon film 3 a patterned resist is formed. With the patterned resist used as a mask, polysilicon film 3 is etched, while a surface of patterned resist 4 alters, indicated in the figure as an altered surface layer of the resist 6.

Figure 3:
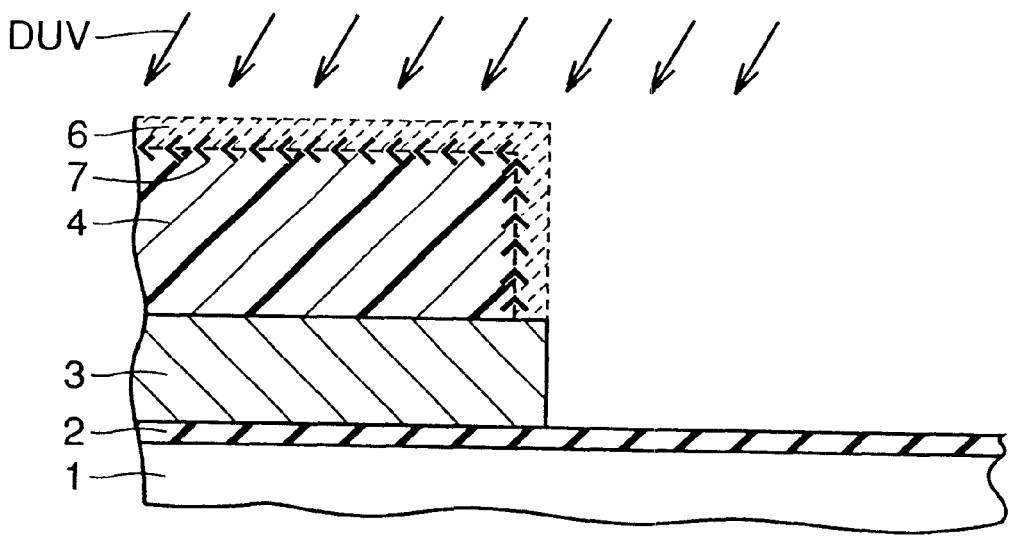

As shown in FIG. 3, altered surface layer 6 is cured in a $N_2$ ambient with a deep ultraviolet ray. This process will be hereinafter referred to as "the DUV cure process." More specifically, a light of 250 nm to 600 nm in wavelength is directed to patterned resist 4 for 100 seconds to heat a stage with silicon substrate 1 mounted thereon to approximately 100° C. to 150° C. In the present embodiment, the DUV light can decompose a photosensitive group of altered surface layer 6 of the resist and that of a normal resist layer 4 to mix them. In the figure, reference numeral 7 denotes a layer formed by mixing them.

Figure 4:
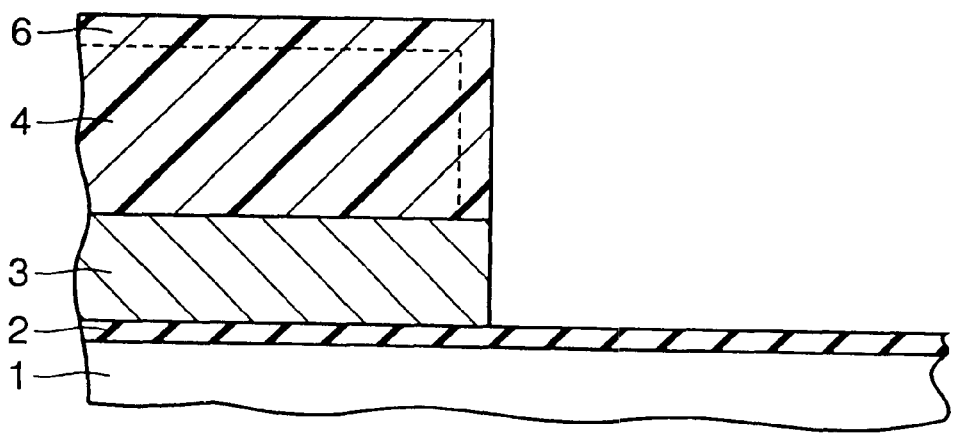

As shown in FIG. 4, with layer 7 thus provided, a thermal process is provided to join altered layer 6 and normal resist layer 4 thereunder together. As such, altered surface layer 6 of the resist can be prevented from being removed. The DUV cure process irradiating surface layer 6 of the resist with a light of a short wavelength can also effectively remove a residual gaseous etchant from the surface layer through a chemical reaction and hence a disadvantageous influence of the residual gas. The present embodiment includes the steps briefly described as follows:

etching of polysilicon → DUV cure (in $N_2$ ambient) → wet-etching with hydrofluoric acid solution.

Sixth Embodiment

The present embodiment is a variation of the third embodiment. The DUV cure process is provided in a dry air rather than a $N_2$ ambient. When the process is provided as described above, an altered surface layer of the resist and a normal resist layer thereunder can be mixed and thus cured and the altered layer can also be effectively removed by approximately several nm by the $O_2$ in the dry air and the $O_3$ (ozone) produced by the DUV light.

The present embodiment includes the steps briefly described as follows:

etching of polysilicon DUV → cure (in dry air) → 4 wet-etching with hydrofluolic acid solution.

Seventh Embodiment

In the present embodiment, an altered surface of a resist can be cured to prevent the altered portion from being removed.

Figure 19:
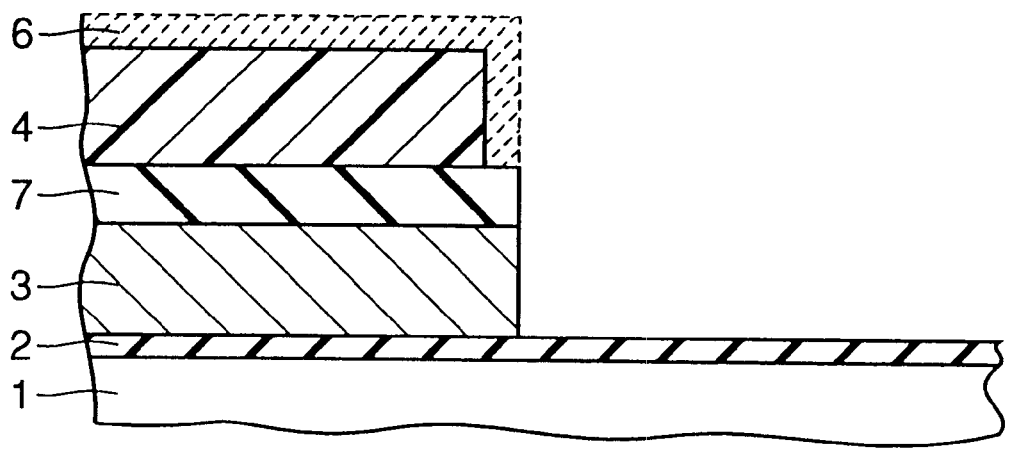
FIGS. 19–21 are cross sections of a semiconductor device manufactured by a method according to a seventh embodiment of the present invention, as shown at first to third steps thereof, respectively.
Figure 20:
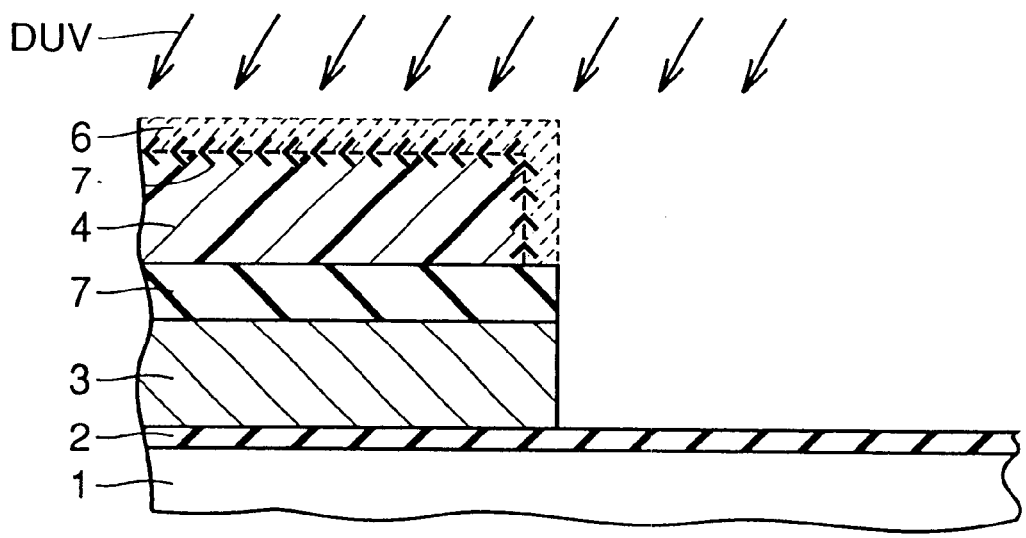

As shown in FIG. 19, on a silicon substrate 1 a $SiO_2$ film 2 is formed. On $SiO_2$ film 2 a polysilicon film 3 is formed by either deposition or deposition followed by patterning. Then a second insulation film 7 is deposited and thereon a patterned resist 4 is then formed. With patterned resist 4 used as a mask, the second insulation film 7 and polysilicon film 3 are etched, while a surface of patterned resist 4 alters. In the figure, reference numeral 6 denotes an altered surface layer of the resist As shown in FIG. 20, altered surface layer 6 of the resist is cured in a $N_2$ ambient with a deep ultraviolet ray. This process will be referred to as "the DUV cure process"hereinafter. More specifically, a light of 250 nm to 600 nm in wavelengths is directed to patterned resist 4 for 100 seconds to heat a stage with silicon substrate 1 mounted thereon to approximately 100° C. to 150° C. In the present embodiment, the DUV light can decompose a photosensitive group of altered surface layer 6 of the photoresist and that of a normal resist layer 4 thereunder and thus mix them. In the figure, reference numeral 7 denotes a layer produced by mixing them.

Figure 21:
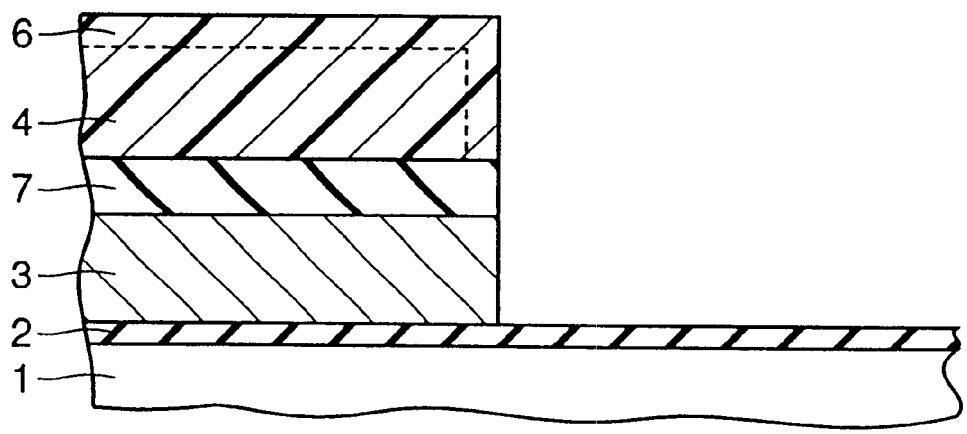

As shown in FIG. 21, with layer 7 provided as described above, a thermal process is provided to join altered layer 6 and underlying normal resist layer 4 together. As such, altered surface layer 6 of the resist can be prevented from being removed. Furthermore, the DUV cure process irradiating surface layer 6 of the resist with a light of a short wavelength can effectively remove a residual gaseous etchant from the surface through a chemical reaction and hence a disadvantageous influence of the residual gas. The present embodiment includes the steps briefly described as follows:

etching of polysilicon → DUV cure (in $N_2$ ambient) → wet-etching with hydrofluoric acid solution.

Eighth Embodiment

The present embodiment is a variation of the seventh embodiment. The DUV cure process is provided in a dry air rather than a $N_2$ ambient. When this process is provided as described above, an altered surface layer of the resist and the normal resist layer thereunder can be mixed together and thus cured and the altered layer can also be effectively removed by approximately several nm by the $O_2$ in the dry air and the $O_3$ produced by the DUV light.

The present embodiment includes the steps briefly described as follows:

etching of polysilicon → DUV cure (in dry air) → wet-etching with hydrofluolic acid solution.

Ninth Embodiment

The present embodiment is also a variation of the fifth and seventh embodiments. The present embodiment does not include the DUV cure process but baking a wafer in an oven filled with a dry air for example at 150° C. for one hour. Although the effect that the altered layer and the normal layer thereunder are mixed together is less expected, the altered layer and the normal layer thereunder can be joined together at their joint when they cure.

The present embodiment includes the steps briefly described as follows:

etching of polysilicon → oven process (at 150° C. for one hour in dry air) → wet-etching with hydrofluoric acid solution.

Tenth Embodiment

The present embodiment is the present invention described above that is applied to an actual semiconductor device. In the present embodiment is described a flash memory manufacturing method using a 2-layer-stacked polysilicon film to form a cell.

Figure 5:
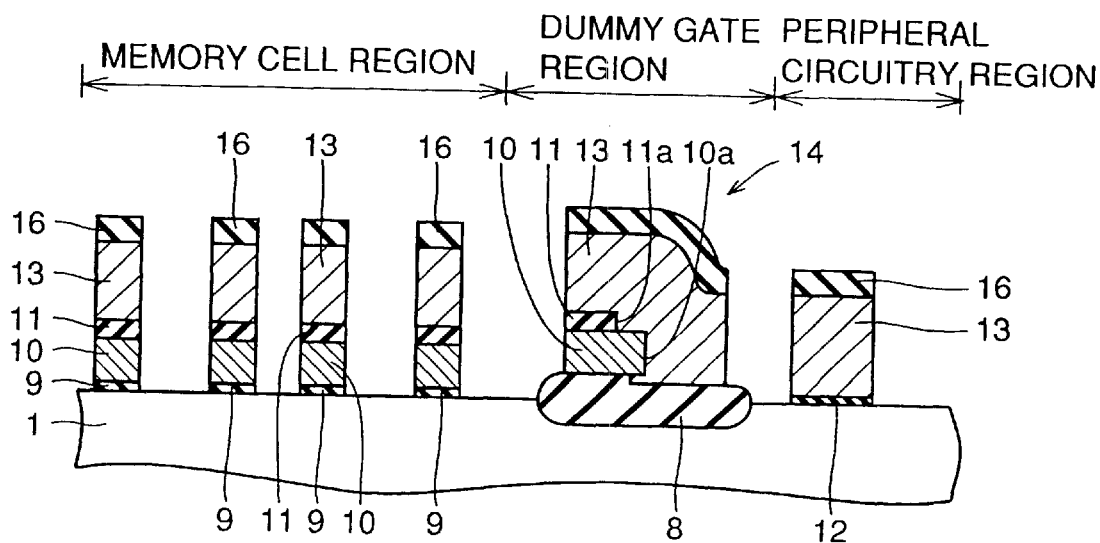
FIG. 5 is a cross section of a semiconductor device manufactured by a flash memory manufacturing method according to a tenth embodiment of the present invention.

FIG. 5 is a cross section of a flash memory manufactured by a method according to a tenth embodiment. The flash memory includes a semiconductor substrate 1. On semiconductor substrate 1 a dummy gate region is provided including a dummy gate 14. On the semiconductor substrate, a memory cell region and a peripheral circuitry region are provided to sandwich the dummy gate region. The dummy gate region includes an isolating oxide film 8 formed on semiconductor substrate 1. On isolating oxide film 8 a first conductive layer 10 is provided. The first conductive layer's end 10a closer to the peripheral circuitry region recedes towards the memory cell region. On the first conductive layer 10 an insulation layer 11 is provided. The insulation layer's end 11a closer to the peripheral circuitry region recedes towards the memory cell region. On isolating oxide film 8, a second conductive layer 13 is provided to cover the first conductive layer 10 and insulation layer 11.

As shown in FIG. 5, the memory cell requires a floating gate and a poly-poly insulation film while the peripheral circuitry does not require such films.

A method of manufacturing the FIG. 5 flash memory will now be described.

Figure 6:
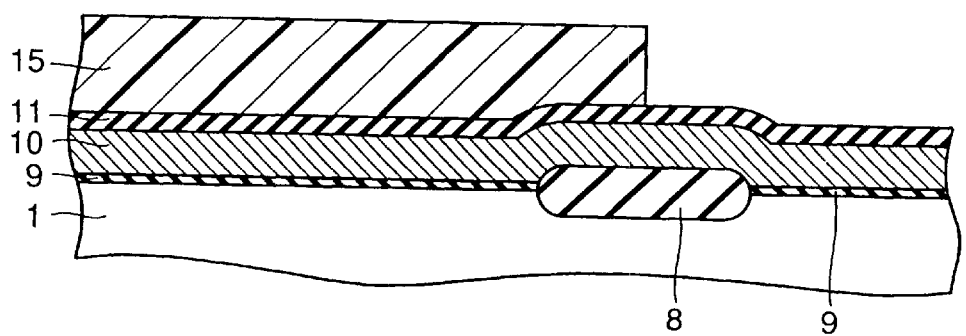
FIGS. 6–10 are cross sections of a semiconductor device manufactured by a flash memory manufacturing method according to the tenth embodiment of the present invention, as shown at first to fifth steps thereof, respectively.

As shown in FIG. 6, on semiconductor substrate 1, isolating oxide film 8 and a tunnel oxide film 9 are formed. Then, on semiconductor substrate 1 a first polysilicon layer 10 (serving as a floating gate) is etched in the X direction (in the horizontal direction in the plane of the figure, not shown). Then a poly-poly insulation film 11 is formed.

Then, photolithography is employed to form on poly-poly insulation film 11 a patterned resist 15 having an end positioned on isolating oxide film 8 and covering only the memory cell region.

Figure 7:
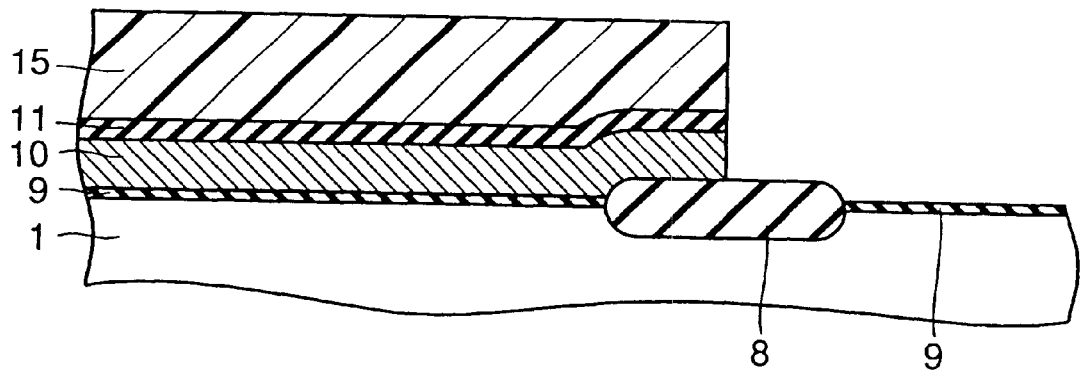

Then, as shown in FIG. 7, with patterned resist 15 used as a mask, a gaseous etchant of $CCl_4$, $HCl_3$ or any other fluorocarbon type is used to etch. poly-poly insulation film 11 and then the first polysilicon layer 10.

If then tunnel oxide film 9 is successively etched with a hydrofluoric acid solution, an altered surface layer of the resist would be removed. As such, the techniques described in the first to ninth embodiments are applied. More specifically, an altered surface layer of patterned resist 15 is removed or the altered layer and a normal resist layer thereunder are joined together to prevent the altered surface layer of the resist from being removed.

After such process as described above, tunnel oxide film 9 of the peripheral circuitry region is etched and thus removed, with patterned resist used as a mask. In the present embodiment the first and second embodiments described above are applied. Then, patterned resist 15 is removed. In the peripheral circuitry region a gate oxide film 12 is formed.

Then, as shown in FIG. 7, a second polysilicon layer 13 and an oxide film 16 used as an etching mask are formed on semiconductor substrate 1. In the present embodiment, the process performed to prevent removal of the altered surface layer of the resist allows patterned resist 15 to recede due to $O_2$ plasma or $O_2$ mixed during the etching sequence. As such, when tunnel oxide film 9 is etched and thus removed, poly-poly insulation film 11 is finished, receding closer to the memory cell region than that according to a conventional process flow. As such, any abrupt step variation would not result when in a subsequent process step a dummy gate 14 is formed in such region, i.e., on isolating oxide film 8. More specifically, isolating oxide film 8+the second polysilicon layer 13 (the portion indicated by arrow A) does not continue directly to isolating oxide film 8+the first polysilicon layer 10+poly-poly insulation layer 11+the second polysilicon layer 13 (the portion indicated by arrow C), which would otherwise result in an abrupt step variation. Rather, isolating oxide film 8+the second polysilicon layer 13 (the portion indicated by arrow A) can continue to isolating oxide film 8 +the second polysilicon layer 13+the first polysilicon layer 10 (the portion indicated by arrow B) and then to isolating oxide film 8+the second polysilicon layer 13+poly-poly insulation film 11+the first polysilicon layer 10 (the portion indicated by arrow C) successively, resulting in a gentle step. As such, in such region and therearound, subsequent photolithography, processing and the like can be advantageously facilitated.

Figure 8:
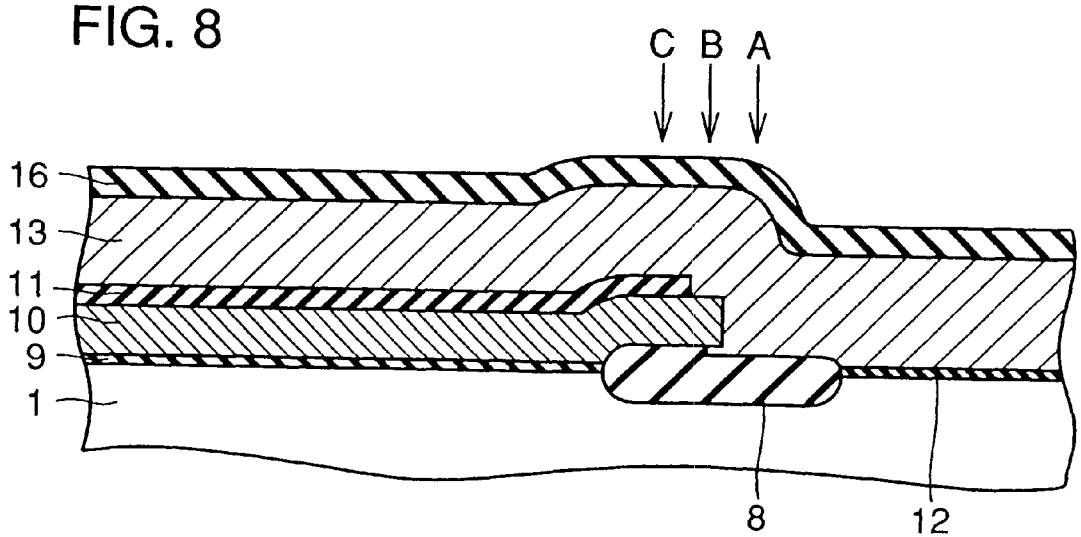
Figure 9:
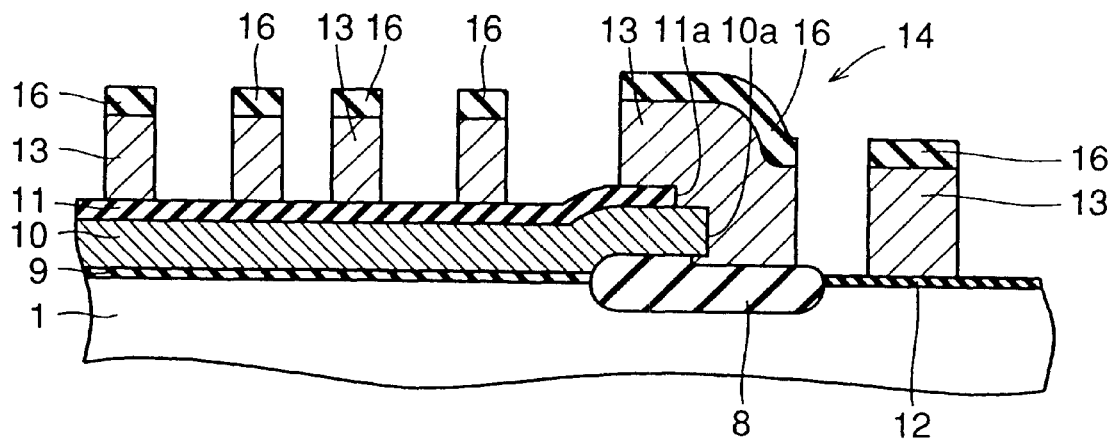

As shown in FIGS. 8 and 9, oxide film 16 used as an etching mask is patterned and a memory cell's control gate 13 and a peripheral circuitry's transistor gate 13 are patterned.

Figure 10:
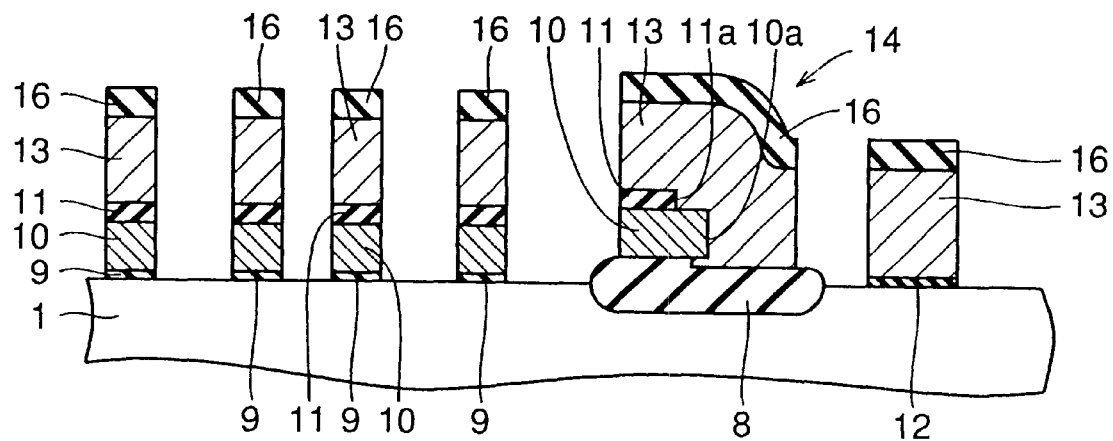
Figure 11:
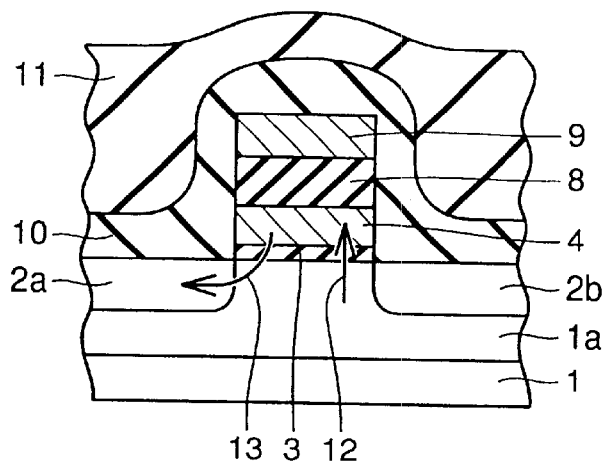
FIG. 11 is a cross section of a conventional flash memory's memory cell.
Figure 12:
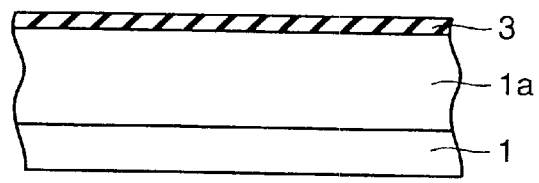
FIGS. 12–15 are cross sections of a semiconductor device manufactured by a conventional flash memory manufacturing method, as shown at first to fourth steps thereof, respectively.
Figure 13:
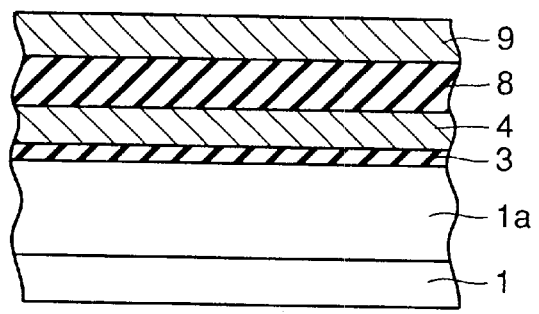
Figure 14:
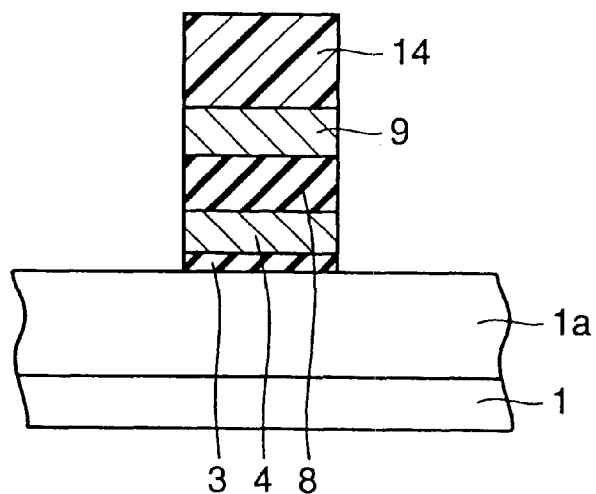
Figure 15:
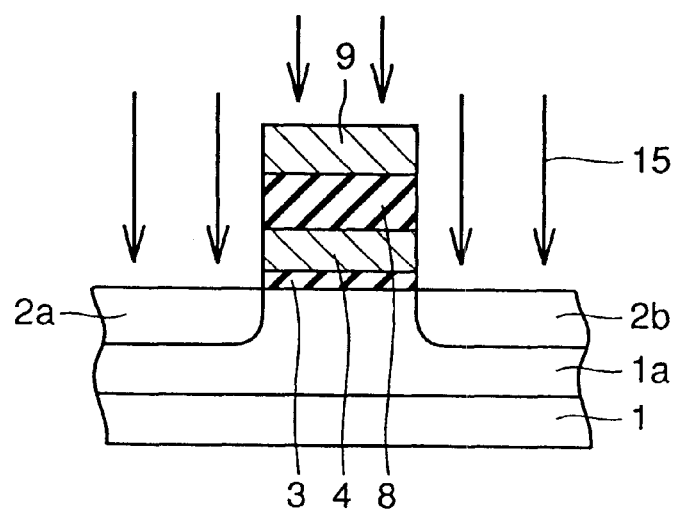
Figure 16:
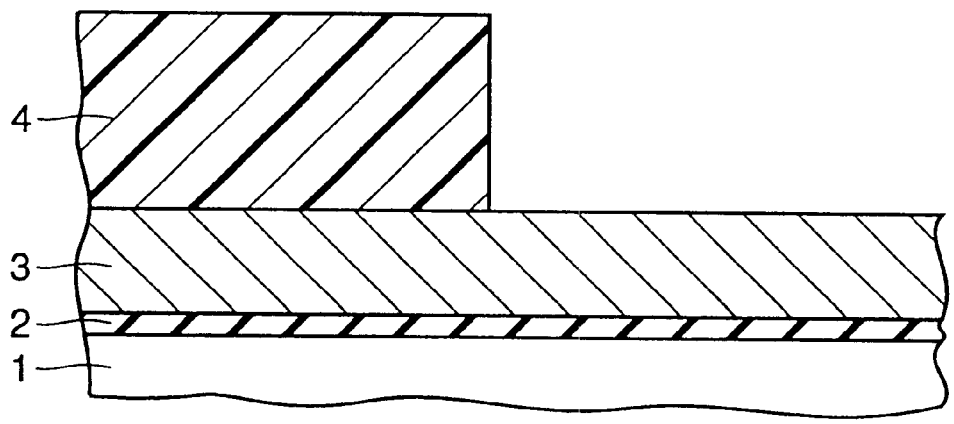
FIGS. 16 and 17 are cross sections of a semiconductor device manufactured by a conventional semiconductor device manufacturing method, showing a disadvantage thereof, as shown at first and second steps thereof, respectively.

As shown in FIG. 10, with oxide film 16 as an etching mask used, poly-poly insulation film 11 and floating gate 10 are etched only in the memory cell region. Thus the FIG. 5 flash memory completes.

Eleventh Embodiment

An SRAM with the present invention applied thereto will now be exemplarily described.

Figure 22:
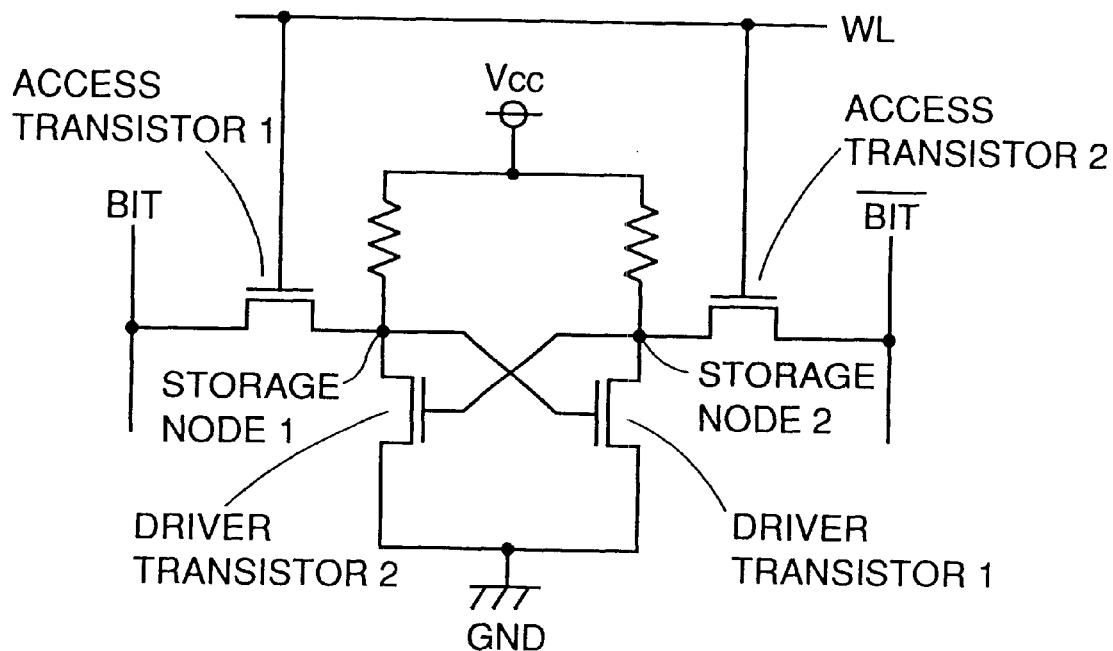
FIG. 22 is an equivalent circuit diagram of a high resistance load type SRAM memory cell.

FIG. 22 shows an equivalent circuit to a high resistance load type SRAM memory cell. In the figure, a storage node 1 is required to connect the access transistor 1 source, the driver transistor 2 drain and the driver transistor 1 gate.

Such portion with the present invention applied thereto will now be exemplarily described.

Figure 23:
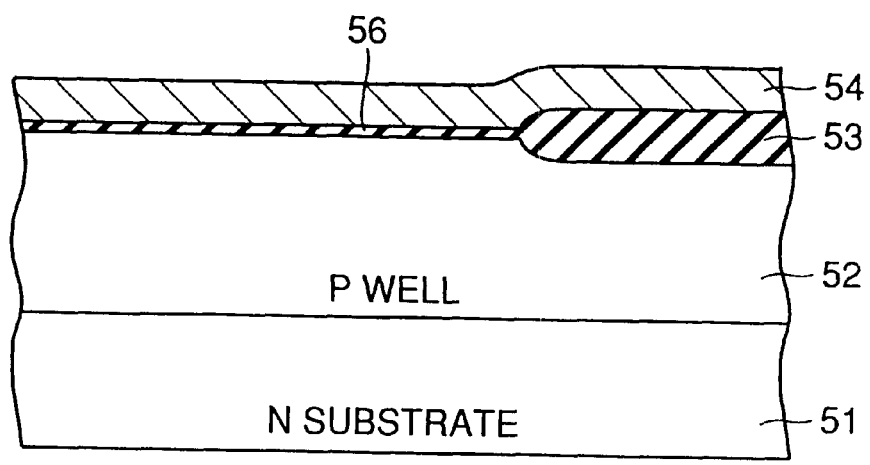
FIGS. 23–25 are cross sections of a semiconductor device manufactured by a method according to an eleventh embodiment of the present invention, as shown at first to third steps thereof, respectively.

For example, as shown in FIG. 23, in an n substrate 51 at p well 52 a field oxide film 53 is provided for isolation and a gate oxide film, a gate electrode and polysilicon 54 that are shared by transistors are deposited.

Figure 24:
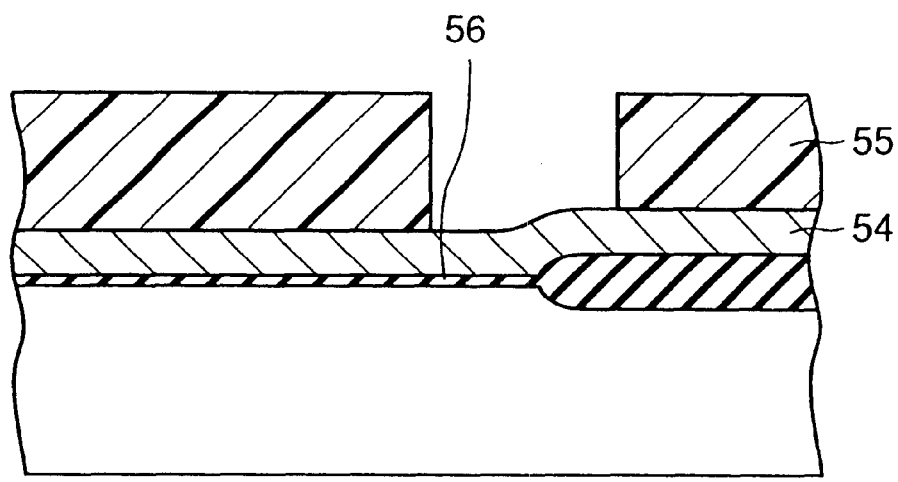

Then, as shown in FIG. 24, patterned resist 55 is provided to form a so-called gate-direct contact 56.

More specifically, patterned resist 55 is provided and polysilicon 54 is dry-etched and gate oxide film 56 is then wet-etched. In this process, a surface of the patterned resist suffers the abnormality as has been described above. As such, the embodiments described above are applied to the process.

Figure 25:
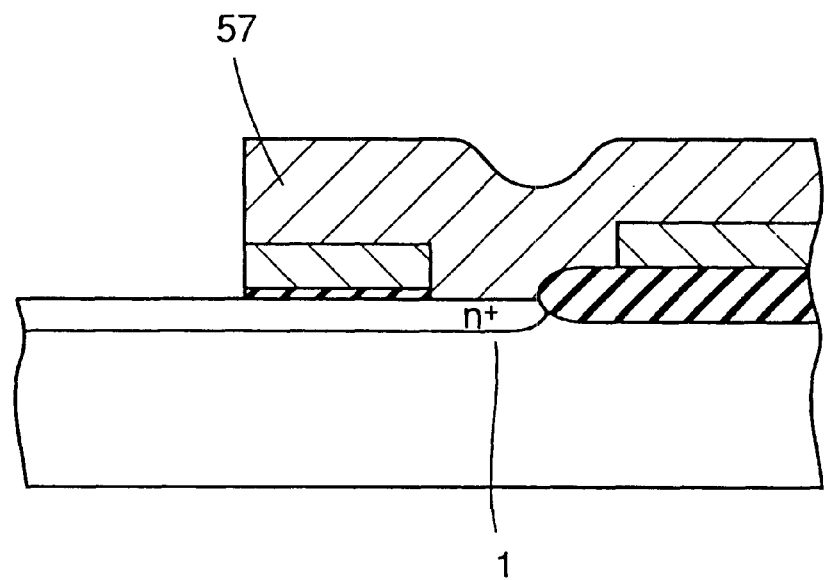

FIG. 25 shows that a gate-direct contact and a gate electrode 57 of driver transistor 1 complete. In the figure, a contact and an active region's n$^+$ region correspond to storage node 1.

If the means using a deep ultraviolet light is applied to the above structure, a gaseous etchant such as chlorine (Cl$_2$), carbon (C) residing in the gate-direct contact can also be effectively removed to expect a reduced contact resistance and no crystal defects between n$^+$ and p well and hence storage node 1 free of electron leakage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device manufacturing method comprising:
   a first step of forming on a semiconductor substrate an insulation film and a conductive layer successively;
   a second step of forming a patterned resist on said conductive layer;
   a third step of dry-etching said conductive layer, with said patterned resist used as a mask;
   a fourth step of partially removing a surface layer of said patterned resist; and
   a fifth step of etching said insulation film, with said patterned resist used as a mask;
   wherein a state random access memory is manufactured, comprising:
   a first step of forming an isolating oxide film on a surface of a semiconductor substrate;
   a second step of depositing a gate oxide film on said semiconductor substrate;
   a third step of depositing a first polysilicon layer on said gate oxide film;
   a fourth step of forming a patterned resist having an oepning extending from an active region to said isolating oxide film;
   a fifth step of dry-etching and thus removing said first polysilicon layer, with said patterned resist used as a mask;
   a sixth step of partially removing a surface layer of said patterned resist;
   a seventh step of removing said gate oxide film at a bottom of said pattern, again with said patterned resist used a mask;
   an eighth step of removing said patterned resist;
   a ninth step of forming a second polysilicon layer;
   a tenth step of forming of resist a pattern providing a gate electrode of an access transistor, a pattern providing a gate electrode of a driver transistor and a pattern providing a gate electrode of a transistor for peripheral circuitry;
   an eleventh step of dry-etching said first and second polysilicon layers, with said patterned resist used as a mask;
   a twelfth step of removing said patterned resist;
   a thirteenth step of doping only an n region with an n dopant; and
   a fourteenth step of thermally processing a resultant product.

2. A semiconductor device manufacturing method comprising:
   a first step of forming on a semiconductor substrate an insulation film and a conductive layer successively;
   a second step of forming a patterned resist on said conductive layer;
   a third step of dry-etching said conductive layer, with said patterned resist used as a mask;
   a fourth step of partially removing a surface layer of said patterned resist; and
   a fifth step of etching said insulation film, with said patterned resist used as a mask;
   wherein a flash memory is manufactured, comprising:
   a first step of forming on a surface of a semiconductor substrate an isolating oxide film isolating a memory cell region and a peripheral circuitry region from each other;
   a second step of forming a tunnel oxide film on a surface of said semiconductor substrate;
   a third step of forming a first polysilicon layer on said tunnel oxide film;
   a fourth step of patterning said tunnel oxide film and said first polysilicon layer, as desired;
   a fifth step of forming an insulation film on said first polysilicon layer;
   a sixth step of forming on said insulation film a patterned resist having an end positioned on said isolating oxide film and covering only said memory cell region;
   a seventh step of dry-etching and thus removing said insulation film and first polysilicon layer overlying said peripheral circuitry region, with said patterned resist used as a mask;
   an eighth step of partially removing a surface of said patterned resist;
   a ninth step of removing said tunnel oxide film overlying said peripheral circuitry region, with said patterned resist used as a mask;
   a tenth step of removing said patterned resist;
   an eleventh step of forming on said semiconductor substrate and on said peripheral circuitry region a gate oxide film for a peripheral transistor;
   a twelfth step of forming a second polysilicon layer on said semiconductor substrate;
   a thirteenth step of forming on said second polysilicon layer an oxide film used as an etching mask;
   a fourteenth step of forming a control gate in said memory cell region and forming a transistor gate for said peripheral circuitry; and a fifteenth step of patterning said insulation film and said first polysilicon layer and forming a floating gate.

3. The method according to claim 2, wherein:

chlorine gas is used to dry-etch said insulation film and said polysilicon layer.

4. A semiconductor device manufacturing method comprising:

a first step of forming on a semiconductor substrate an insulation film and a conductive layer successively;

a second step of forming a patterned resist on said conductive layer;

a third step of dry-etching said conductive layer, with said patterned resist used as a mask;

a fourth step of joining together an altered surface layer of said patterned resist and a normal layer of said patterned resist underlying said surface thereof, and thus preventing said altered layer and said normal layer from being removed; and a fifth step of etching said insulation film, with said patterned resist used as a mask;

wherein a flash memory is manufactured, comprising:

a first step of forming on a surface of a semiconductor substrate an isolating oxide film isolating a memory cell region and a peripheral circuitry region from each other;

a second step of forming a tunnel oxide film on a surface of said semiconductor substrate;

a third step of forming a first polysilicon layer on said tunnel oxide a fourth step of patterning said tunnel oxide film and said first polysilicon layer, as desired;

a fifth step of forming an insulation film on said first polysilicon layer;

a sixth step of forming on said insulation film a patterned resist having an end positioned on said isolating oxide film and covering only said memory cell region;

a seventh step of dry-etching and thus removing said insulation film and first polysilicon layer overlying said peripheral circuitry region, with said patterned resist used as a mask;

an eighth step of joining together an altered surface layer of said patterned resist and a normal portion of 'said patterned resist underlying said surface thereof, to prevent said altered surface layer and said normal portion from being removed;

a ninth step of removing said tunnel oxide film overlying said peripheral circuitry region, with said patterned resist used as a mask;

a tenth step of removing said patterned resist;

an eleventh step of forming on said semiconductor substrate and on said peripheral circuitry region a gate oxide film for a peripheral transistor;

a twelfth step of forming a second polysilicon layer on said semiconductor substrate;

a thirteenth step of forming on said second polysilicon layer an oxide film used as an etching mask;

a fourteenth step of forming a control gate in said memory cell region and forming a transistor gate for said peripheral circuitry; and a fifteenth step of patterning said insulation film and said first polysilicon layer and forming a floating gate.

5. A semiconductor device manufacturing method comprising:

a first step of forming on a semiconductor substrate an insulation film and a conductive layer successively;

a second step of forming a patterned resist on said conductive layer;

a third step of dry-etching said conductive layer, with said patterned resist used as a mask;

a fourth step of joining together an altered surface layer of said patterned resist and a normal layer of said patterned resist underlying said surface thereof, and thus preventing said altered layer and said normal layer from being removed; and a fifth step of etching said insulation film, with said patterned resist used as a mask;

wherein a static random access memory is manufactured, comprising:

a first step of forming an isolating oxide film on a surface of a semiconductor substrate;

a second step of depositing a gate oxide film on said semiconductor substrate;

a third step of depositing a first polysilicon layer on said gate oxide film;

a fourth step of forming a patterned resist having an opening extending from an active region to said isolating oxide film;

a fifth step of dry-etching and thus removing said first polysilicon layer, with said patterned resist used as a mask;

a sixth step of partially removing a surface layer of said patterned resist;

a seventh step of removing said gate oxide film at a bottom of said pattern, again with said patterned resist used as a mask;

an eighth step of removing said patterned resist;

a ninth step of forming a second polysilicon layer;

a tenth step of forming of resist a pattern providing a gate electrode of an access transistor, a pattern providing a gate electrode of a driver transistor and a pattern providing a gate electrode of a transistor for peripheral circuitry;

an eleventh step of dry-etching said first and second polysilicon layers, with said patterned resist used as a mask;

a twelfth step of removing said patterned resist;

a thirteenth step of doping only an n region with an n dopant; and a fourteenth step of thermally processing a resultant product.

* * * * *

UNITED STATES PATENT AND TRADEMARK OFFICE
CERTIFICATE OF CORRECTION

PATENT NO.    : 6,458,655 B1
DATED         : October 1, 2002
INVENTOR(S)   : Kojiro Yuzuriha et al.

It is certified that error appears in the above-identified patent and that said Letters Patent is hereby corrected as shown below:

<u>Title page,</u>
Item [73], Assignees, within the second assignee after the word "Engineering" insert the word -- Corporation --

Signed and Sealed this

Tenth Day of June, 2003

JAMES E. ROGAN
*Director of the United States Patent and Trademark Office*